United States Patent
Ying

(10) Patent No.: US 10,862,424 B2
(45) Date of Patent: Dec. 8, 2020

(54) PARALLEL-BASED SWITCHING INDUCTOR DEVICE

(71) Applicant: MEDIATEK INC., Hsin-Chu (TW)

(72) Inventor: Yu-Ming Ying, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 16/149,147

(22) Filed: Oct. 2, 2018

(65) Prior Publication Data

US 2019/0245486 A1 Aug. 8, 2019

Related U.S. Application Data

(60) Provisional application No. 62/627,278, filed on Feb. 7, 2018.

(51) Int. Cl.
| | |
|---|---|
| *H03B 5/12* | (2006.01) |
| *H03B 7/00* | (2006.01) |
| *H03B 7/02* | (2006.01) |
| *H01L 23/64* | (2006.01) |
| *H01F 38/00* | (2006.01) |
| *H01F 38/14* | (2006.01) |
| *H01F 27/28* | (2006.01) |

(52) U.S. Cl.
CPC ........... *H03B 5/1228* (2013.01); *H01F 27/28* (2013.01); *H01F 38/00* (2013.01); *H01F 38/14* (2013.01); *H01L 23/645* (2013.01); *H03B 5/1268* (2013.01); *H03B 7/00* (2013.01); *H03B 7/02* (2013.01); *H01L 2924/00* (2013.01); *H03B 2200/009* (2013.01); *H03B 2200/0082* (2013.01); *H03B 2201/0266* (2013.01)

(58) Field of Classification Search
CPC . H01L 23/645; H01L 2924/00; H03B 5/1212; H03B 5/1228; H03B 5/1268; H03B 7/00; H03B 7/02; H03B 2200/0082; H03B 2200/009; H03B 2201/0266; H01F 7/0013; H01F 38/00
USPC .... 331/167, 117 FE, 107 SL, 36 L; 336/232, 336/225, 200; 334/56
See application file for complete search history.

(56) References Cited

U.S. PATENT DOCUMENTS 8,633,777 B2 * 1/2014 Jin ................. H01L 23/645
331/117 FE
8,842,410 B2 * 9/2014 Chan .................. H01F 21/12
307/37

FOREIGN PATENT DOCUMENTS

| CN | 102306642 A | 1/2012 |
|---|---|---|
| CN | 102483984 A | 5/2012 |

* cited by examiner

*Primary Examiner* — Arnold M Kinkead
(74) *Attorney, Agent, or Firm* — Winston Hsu

(57) ABSTRACT

A switching inductor device having a first port and a second port includes a first inductor and a second inductor with a switch circuit. The first inductor is coupled between the first port and the second port. The second inductor and the switch circuit are connected in series, and are coupled between the first port and the second port; the first inductor and the second inductor are connected in parallel when the switch circuit is turned on.

8 Claims, 6 Drawing Sheets

PARALLEL-BASED SWITCHING INDUCTOR DEVICE

CROSS REFERENCE TO RELATED APPLICATIONS

This application claims priority of U.S. provisional application Ser. No. 62/627,278 filed on Feb. 7, 2018, which is entirely incorporated herein by reference.

BACKGROUND

Generally speaking, for an LC (inductor-capacitor) tank of a conventional oscillator apparatus, increasing the value of the whole quality factor of such LC tank can reduce phase noise and power dissipation. The quality factor of LC tank is determined by the quality factors of the inductor and capacitor within such LC tank. For a low frequency oscillation apparatus, the conventional scheme is usually to tune/adjust the capacitor of LC tank since the quality factor of the inductor dominates the whole quality factor of LC tank and tuning/adjusting the inductor may reduce the quality actor. However, for a high frequency oscillation apparatus, it becomes not appropriate to tune the capacitor since the quality factor of the capacitor will dominate the whole quality factor and tuning/adjusting the capacitor may reduce the quality actor for the high frequency oscillator apparatus. Thus, for the high frequency oscillator apparatus, the conventional scheme may adopt multiple circuit architectures such as a transformer-based inductive tuning circuit and a serial-based inductive tuning circuit to perform inductive tuning.

Inevitably, the above-mentioned inductive tuning circuits cannot provide different inductances with a significant variation range as well as maintain or keep the value of the inductive quality value at a higher value. This is because for the conventional circuit architectures there exist tradeoffs between the turned-on resistance of a MOS transistor switch and the parasitic capacitance caused by the MOS transistor switch. The turned-on resistance can be designed to be smaller but the parasitic capacitance will become larger to damage the quality factor. In addition, the quality factor is also damaged by the turned-on resistance if the turned-on resistance becomes larger.

SUMMARY

Therefore one of the objectives of the invention is to provide a novel parallel-based switching inductor device, to solve the above-mentioned problems.

According to embodiments of the invention, an inductor device having a first port and a second port includes a first inductor and a second inductor with a switch circuit. The first inductor is coupled between the first port and the second port. The second inductor and the switch circuit are connected in series, and are coupled between the first port and the second port; the first inductor and the second inductor are connected in parallel when the switch circuit is turned on.

According to the embodiments, an oscillator apparatus is disclosed. The apparatus comprises an LC tank which comprises a capacitor array and a switching inductor device. The capacitor array is coupled to the switching inductor device. The switching inductor device has a first port and a second port, and comprises a first inductor and a second inductor with a switch circuit. The first inductor is coupled between the first port and the second port. The second inductor and the switch circuit are connected in series, and both are coupled between the first port and the second port. The first inductor and the second inductor are connected in parallel when the switch circuit is turned on.

According to the embodiments, the parallel-based switching inductor device is capable of providing different inductances with a significant variation range in different switching modes as well as maintaining the value of quality factor at a higher value or keeping the variation of quality factor within a smaller range. That is, the provided parallel-based switching inductor device can perform inductive turning without damaging the quality factor of the inductor equivalently. Particularly, such parallel-based switching inductor device is suitable to implement an inductor of LC tank for a high frequency oscillator apparatus which for example generates the oscillation frequency at the neighborhood of 20 GHz or above 20 GHz.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
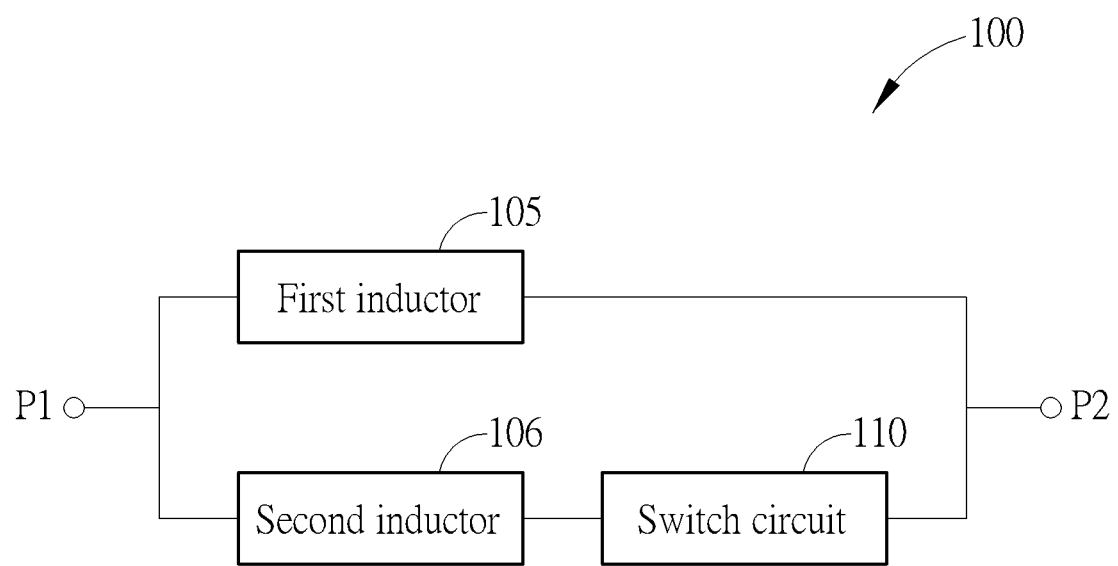
FIG. 1 is a simplified diagram of a parallel-based switching inductor device according to embodiments of the invention.

FIG. 1 is a simplified diagram of a parallel-based switching inductor device 100 according to embodiments of the invention. The inductor device 100 comprises a first port P1 such as an input port (but not limited) and a second port P2 such as an output port (but not limited). Parallel-based means that the switching inductor device 100 controls at least two inductors be connected in parallel to provide a specific inductance when the device 100 is operated in a specific mode.

The inductor device 100 is a switching inductor which is capable of providing different inductances in different modes. For example, based on a specific design (but not limited), the inductor device 100 may be arranged to selectively provide an inductance of 120 pH (picot henry) and a different inductance of 170 pH in two different modes while the value of a corresponding quality factor in such different modes can be almost maintained or merely have a slight variation. For instance, in the above example, the value of the corresponding quality factor may merely vary from 18 to 16. That is, in such example, the inductor device 100 can provide different inductances with an inductance variation range above thirty percent as well as keep or maintain the variation range of the corresponding quality factor below ten percent. Compared to the conventional scheme, the inductor device 100 has a significantly improved performance. In addition, it is to be noted that the inductance values and examples of variation ranges are not intended to be a limitation. The inductor device 100 in other examples may be arranged to provide different inductances.

Figure 6:
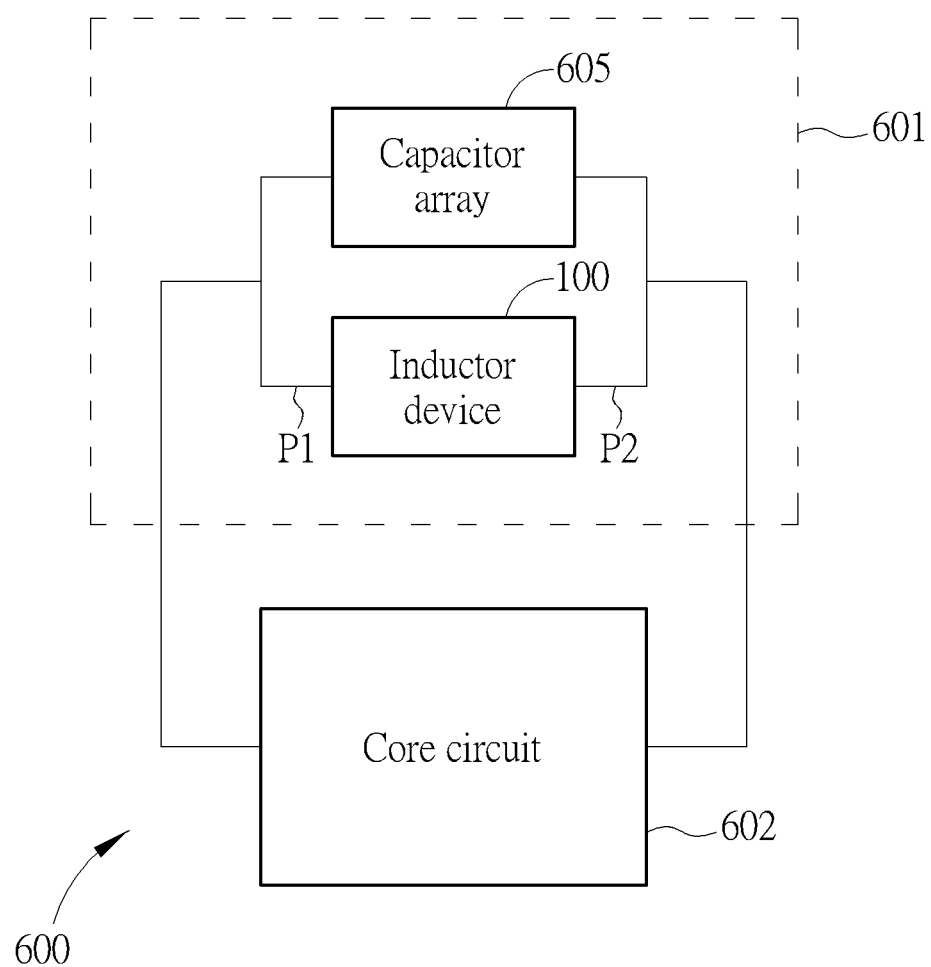
FIG. 6 is a diagram showing an application example of a high frequency VCO apparatus having the switching inductor device of FIG. 1 according an embodiment of the invention.

For applications, the switching inductor 100 for example is particularly suitable for a high frequency VCO (voltage controlled oscillator) circuit wherein the switching inductor 100 is used with a capacitor device/array to form an inductor-capacitor (LC) tank. Usually, for the high frequency VCO, e.g. operating above 20 GHz (but not limited), the capacitor device may be configured with an almost constant or almost fixed capacitance. However, this is not intended to be a limitation. FIG. 6 is a diagram showing an application example of a high frequency VCO apparatus 600 having the switching inductor device 100 of FIG. 1 according an embodiment of the invention. The VCO apparatus 600 comprises an LC tank 601 and a VCO core circuit 602 which for example comprises a cross-coupled transistor pair (but not limited). The LC tank 601 comprises a capacitor array 605 and the switching inductor device 100. In such application, the switching inductor device 100 can be arranged to provide different inductances in different operation modes so that the apparatus 600 can accurately lock and generate an oscillation frequency. Operations and functions of switching inductor device 100 are detailed in the following paragraphs.

Refer to FIG. 1. The inductor device 100 comprises a first inductor 105, a second inductor 106, and a switch circuit 110. The first inductor 105 is coupled between the first port P1 and the second port P2. The second inductor 106 and the switch circuit 110 are connected in series, and both are coupled between the first port P1 and the second port P2. For example, in FIG. 1, the second inductor 106 is coupled between the first port P1 and the switch circuit 110, and the switch circuit 110 is coupled between the second inductor 106 and the second port P2. However, this is not meant to be a limitation. In other embodiments, the second inductor 106 may be coupled between the second port P2 and the switch circuit 110, and the switch circuit 110 is coupled between the second inductor 106 and the first port P1; that is, the circuit positions of second inductor 106 and switch circuit 110 are exchanged. In addition, in one embodiment, the second inductor 106 may be configured to have a first portion and a second portion, and the switch circuit 110 is disposed or displaced between the first portion and the second portion. These modifications all fall within the scope of the invention.

In addition, the switch circuit 110 for example is implemented by using a MOS transistor. For operation, the first inductor 105 and the second inductor 106 are/become connected in parallel when the switch circuit 110 (i.e. the MOS transistor) is turned on. In addition, the first inductor 105 and the second inductor 106 are not connected in parallel when the switch circuit 110 is turned off. That is, in the turned-on mode, the signal current occurring at the first port P1 is arranged to pass through both the first inductor 105 and second inductor 106 since the first inductor 105 and the second inductor 106 are/become connected in parallel. For example, if the inductances of first and second inductors are designed to be equal, then the inductor device 100 is arranged to provide half of the inductance of first/second inductor 105 or 106 for the signal current. Instead, in the turned-off mode, the signal current occurring at the first port P1 is arranged to pass through only the first inductor 105 since the second inductor 106 is equivalently disconnected from the second port P2. Thus, the inductor device 100 is arranged to provide the inductance of first inductor 105 for the signal current. By doing so, the inductor device 100 can provide different inductances with a significant variation range.

Figure 2:
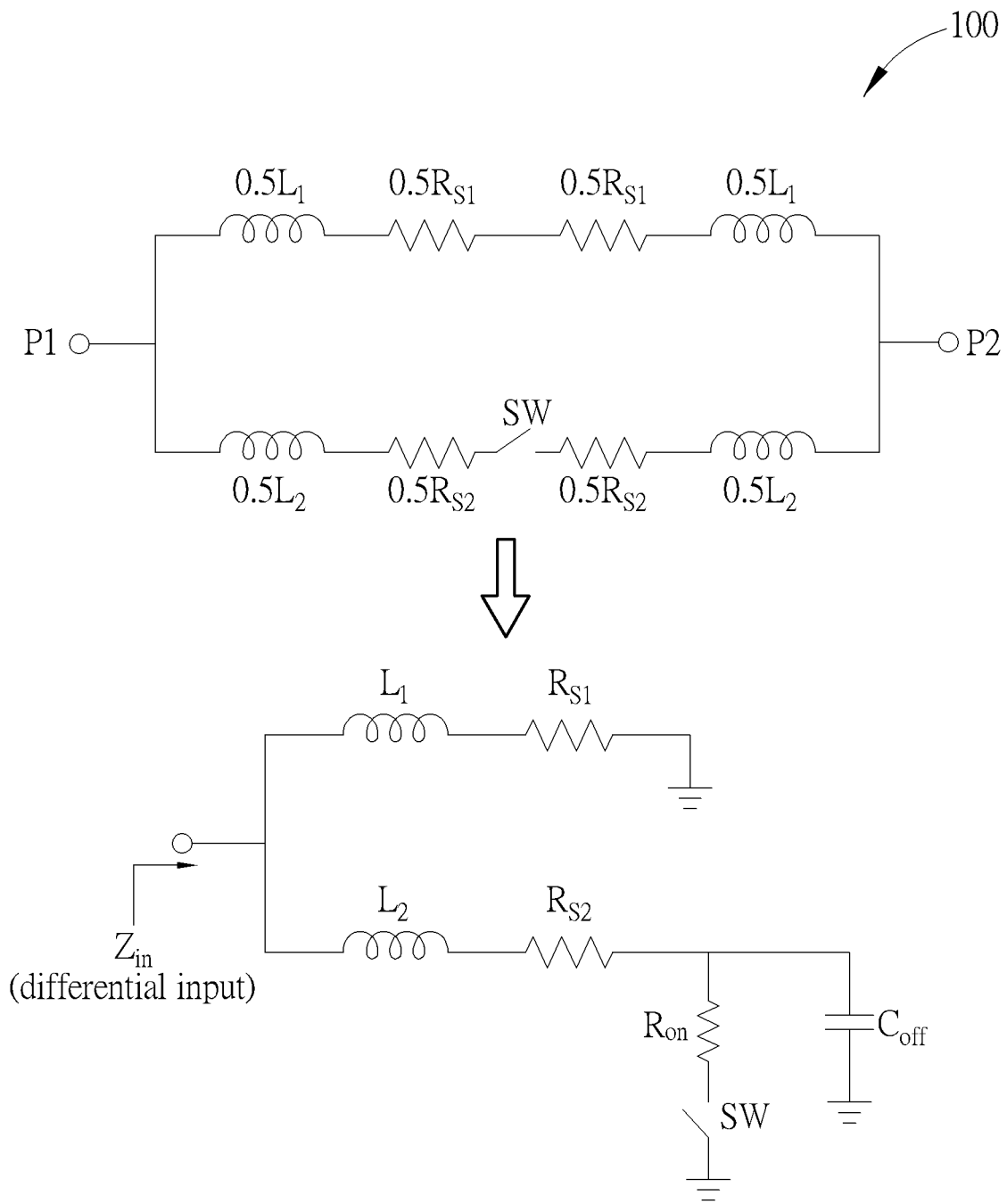
FIG. 2 is a diagram showing an equivalent circuit of the inductor device as shown in FIG. 1.

FIG. 2 is a diagram showing an equivalent circuit of the inductor device 100 as shown in FIG. 1. As shown on the upper half of FIG. 2, the first inductor 105 may be implemented by using two serial-connected inductors each having the inductance of 0.5 $L_1$ with the parasitic resistance of 0.5 $R_{S1}$ wherein $L_1$ means the inductance of first inductor 105, and $R_{S1}$ means the parasitic resistance of the first inductor 105. The second inductor 106 may be implemented by using two serial-connected inductors each having the inductance of 0.5 $L_2$ with the parasitic resistance of 0.5 $R_{S2}$ wherein $L_2$ means the inductance of second inductor 106 and $R_{S2}$ means the parasitic resistance of the second inductor 106 while the switch SW representing the switch circuit 100 is disposed between the two parasitic resistances 0.5 $R_{S2}$. In addition, as shown on the bottom half of FIG. 2, it shows the equivalent circuit impedance $Z_{in}$ seen from a differential input signal at the port P1. $R_{on}$ means the parasitic resistance of the switch circuit 110 implemented by the MOS transistor when the MOS transistor is turned on, and $C_{off}$ means that parasitic capacitance of the MOS transistor when the MOS transistor is turned off. SW means the switch which is closed when the MOS transistor is turned on and is open when such transistor is turned off. For example, if the inductor device 100 is applied for a high frequency VCO, then it can be assumed that the parasitic resistance $R_{on}$ is very smaller than $$\frac{1}{\omega \times C_{off}}$$

wherein $\omega$ is associated with an oscillation frequency of the high frequency VCO, and the parasitic resistance $R_{on}$ is very larger than the parasitic resistances $R_{S1}$ and $R_{S2}$. For example, the parasitic resistance $R_{on}$, e.g. 10Ω (ohm), may be multiple times more than each of the parasitic resistances $R_{S1}$ and $R_{S2}$, e.g. 1Ω-2Ω. However, this is not intended to be a limitation. The inductance $L_{on}$ provided by the inductor device 100 when the switch circuit 110 is turned on can be represented in the following equation:

$$L_{on} = \frac{\omega^2 L_1 L_2 (L_1 + L_2) + L_1 R_{on}^2 + L_2 R_{S1}^2}{\omega^2 (L_1 + L_2)^2 + (R_{S1} + R_{on})^2} \cong \frac{L_1 L_2}{L_1 + L_2}$$

the impedance/resistance $Z_{in}$ of the inductor device 100, seen from the first port P1, can be represented in the following equation:

$$Z_{in} = \frac{\omega^2 (L_1^2 R_{on} + L_2^2 R_{S1}) + R_{on} R_{S1} (R_{on} + R_{S1})}{\omega^2 (L_1 + L_2)^2 + (R_{S1} + R_{on})^2} =$$

$$\frac{\omega^2 L_1^2}{\omega^2 (L_1 + L_2)^2 + R_{on}^2} R_{on} \cong \left(\frac{L_1}{L_1 + L_2}\right)^2 R_{on}$$

In an example, if the inductance $L_1$ of first inductor 105 is designed to be equal to the inductance $L_2$ of second inductor 106, then in this situation the inductance of inductor device 100 is equal to half of the inductance $L_1$ and the parasitic resistance of inductor device 100 is equal to quarter of parasitic resistance $R_{on}$, 25% of $R_{on}$. For example, if the parasitic resistance $R_{on}$ is 10Ω, then the parasitic resistance of inductor device 100 can be equal to 2.5Ω which is almost equal to the parasitic resistances $R_{S1}$ and $R_{S2}$.

Instead, when the switch circuit 110 is turned off, the inductance $L_{off}$ provided by the inductor device 100 when the switch circuit 110 is turned off can be represented in the following equation:

$$L_{off}=L_1$$

assuming that $$\omega << \frac{1}{\sqrt{L_2 C_{off}}},$$

the impedance/resistance $Z_{in}$ of the inductor device 100, seen from the first port P1 when the switch circuit 110 is turned off, can be represented in the following equation:

$$Z_{in}=R_{S1}$$

That is, in different switching modes, the inductor device 100 can be arranged to provide different inductances within a significant variation range of fifty percent as well as maintain and keep the parasitic resistance/impedance at a smaller value such as 1Ω-2Ω, i.e. almost a general parasitic resistance of an inductor. Thus, the value of quality factor of inductor device 100 is maintained or kept at a particular greater value no matter when the MOS transistor of switch circuit 110 is turned on or turned off.

Figure 3:
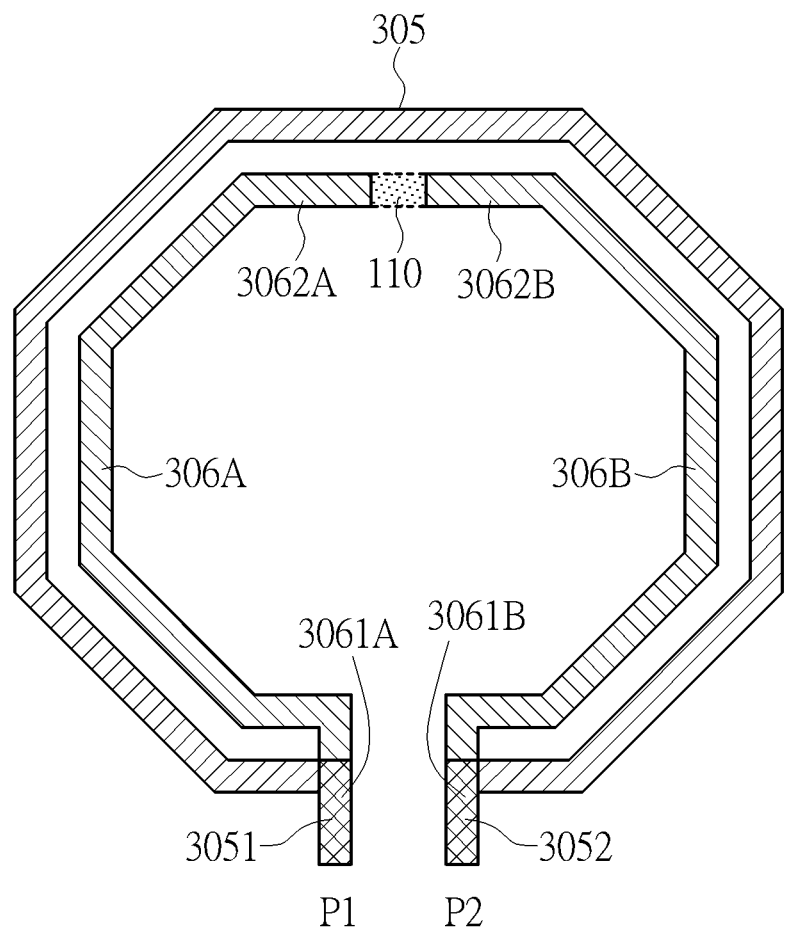
FIG. 3 is a diagram of an implementation layout of inductor device of FIG. 1 according to a first embodiment of the invention.

FIG. 3 is a diagram of an implementation layout of inductor device 100 of FIG. 1 according to a first embodiment of the invention. For example, the first and second inductors 105 and 106 can be implemented by using coils such as wirings at metal layer(s)/trace(s). In practice, the second inductor 106 is implemented by using a coil which comprises a first portion and a second portion. For example, such coil is implemented by using a wiring, and the first portion is a first partial wiring while the second portion is a second partial wiring. The switch circuit 110 is configured between the first partial wiring and the second partial wiring.

As shown by FIG. 3, the first inductor 105 for example is implemented by an outer wiring 305 (but not limited) configured/disposed on a first metal layer/trace such as a top metal layer/trace, and the second inductor 106 for example is implemented by an inner wiring (306A/306B) configured/disposed on a second metal layer/trace such as a bottom metal layer/trace. That is, the wirings of first and second inductors 105 and 106 are disposed on different metal layers, and this can effectively reduce the required circuit die size. However, this is not meant to be a limitation. In other embodiments, the first inductor 105 may be implemented by using an inner wiring, and the second inductor 106 may be implemented by using an outer wiring. Further, the first inductor 105 may be displaced or disposed on the bottom metal layer, and the second inductor 106 may be displaced on the top metal layer. These modifications all fall within the scope of the invention.

In addition, the shape of the wiring 305 of the first inductor 105 is an octagon on FIG. 3. However, this is not intended to be a limitation. The shape of the wiring 305 of the first inductor 105 can be other shapes such as a polygon or a circle. In addition, the shape of inner wiring formed by the first and second partial wirings 306A and 306B if the switch circuit 110 is turned on can be regarded as an octagon, and may be other shapes such as a polygon or a circle in other examples.

In addition, each of the inner and outer wirings on FIG. 3 comprises a single one lap of trace/wiring. In other embodiments, each of the wirings may be implemented by using two or more laps of trace/wiring. That is, each of the wirings may be a spiral wiring. The modifications all fall within the scope of the invention.

In addition, for example, the material of the wiring 305 of the first inductor 105 can be different from that of the wiring (306A/306B) of the second inductor 106. Different wirings may be implemented by adopting materials having different metal types.

Figure 4:
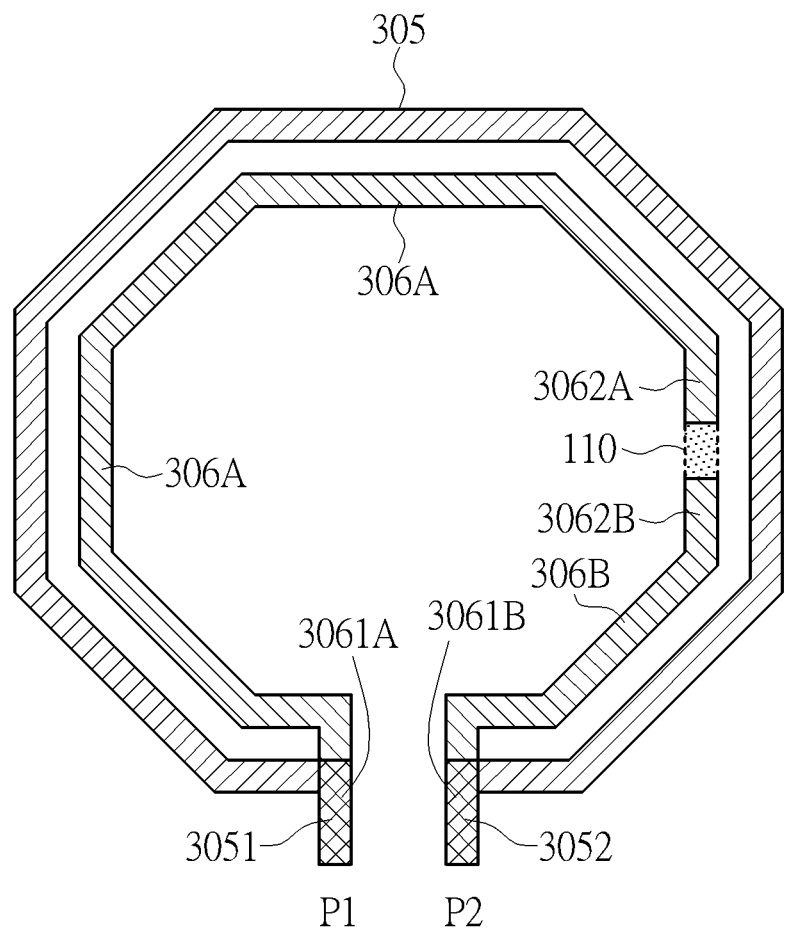
FIG. 4 is a diagram of an implementation layout of inductor device of FIG. 1 according to a second embodiment of the invention.

In addition, the total length of the first partial wiring 306A may be configured to be equivalently equal to that of the second partial wiring 306B; however, this is not meant to be a limitation. In one embodiment, the total length of the first partial wiring 306A may be longer or shorter than that of second partial wiring 306B. The layout position of switch circuit 110 in such example is configured to be different from that shown on FIG. 3. FIG. 4 is a diagram of an implementation layout of inductor device 100 of FIG. 1 according to a second embodiment of the invention.

Further, in other embodiments, the outer wiring may be disposed to surround the inner wiring if the outer wiring and inner wiring are disposed on the same metal layer/trace.

Further, in other embodiments, at the vertical direction view, the wiring of the first inductor 105 at the first metal layer/trace may be configured to be at least partially overlapped with the wiring of the second inductor 106 at a second metal layer/trace different from the first metal layer/trace. For example, the wiring at a top metal layer may be overlapped with at least one portion of the wiring at a bottom metal layer at the vertical direction view. Such modification also obeys the spirit of the invention.

In practice, in FIG. 3, the outer wiring 305 of first inductor 105 has a first end 3051 coupled to the first port P1 and a second end 3052 coupled to the second pot P2. The first partial wiring 306A has a first end 3061A coupled to the first port P1 and a second end 3062A coupled to the switch circuit 110. The second partial wiring 306B has a first end 3061B coupled to the second port P2 and a second end 3062B coupled to the switch circuit 110. The switch circuit 110 is disposed or displaced between the first partial wiring 306A and the second partial wiring 306B. The first end 3051 of outer wiring 305 may be partially overlapped with the first end 3061A of first partial wiring 306A of inner wiring in the vertical direction at first port P1. The second end 3052 of outer wiring 305 may be partially overlapped with the first end 3061B of second partial wiring 306B of inner wiring in the vertical direction at first port P2. The MOS transistor of switch circuit 110 is represented by dots, and can be implemented in identical metal layers or in a different metal layer.

When/if the switch circuit 110 is turned on, the first partial wiring 306A is connected to the second partial wiring 306B via the turned-on switch circuit 110 to form a complete wiring of the second inductor 106. When/if the switch circuit 110 is turned off, the second ends 3062A and 3062B of first and second partial wirings 306A and 306B both are at the open-circuit state. The first and second partial wirings 306A and 306B are disconnected. When/if the MOS transistor is turned off, the first portion of second inductor 106 and the second portion of second inductor 106 are disconnected, and the signal current is arranged to flow through the first inductor 105. Only the inductance and parasitic resistor of the first inductor 105 are seen from the first port P1 in this situation. When/if the MOS transistor is turned on, the first portion of second inductor 106 and the second portion of second inductor 106 are connected via the MOS transistor, and the signal current is arranged to flow through both the first inductor 105 and second inductor 106. Equivalently, when the switch circuit 110 (i.e. MOS transistor) is turned on, the first portion of second inductor 106 and the second portion of second inductor 106 are connected in series. In addition, the first inductor 105 and the second inductor 106 are coupled in parallel.

Figure 5:
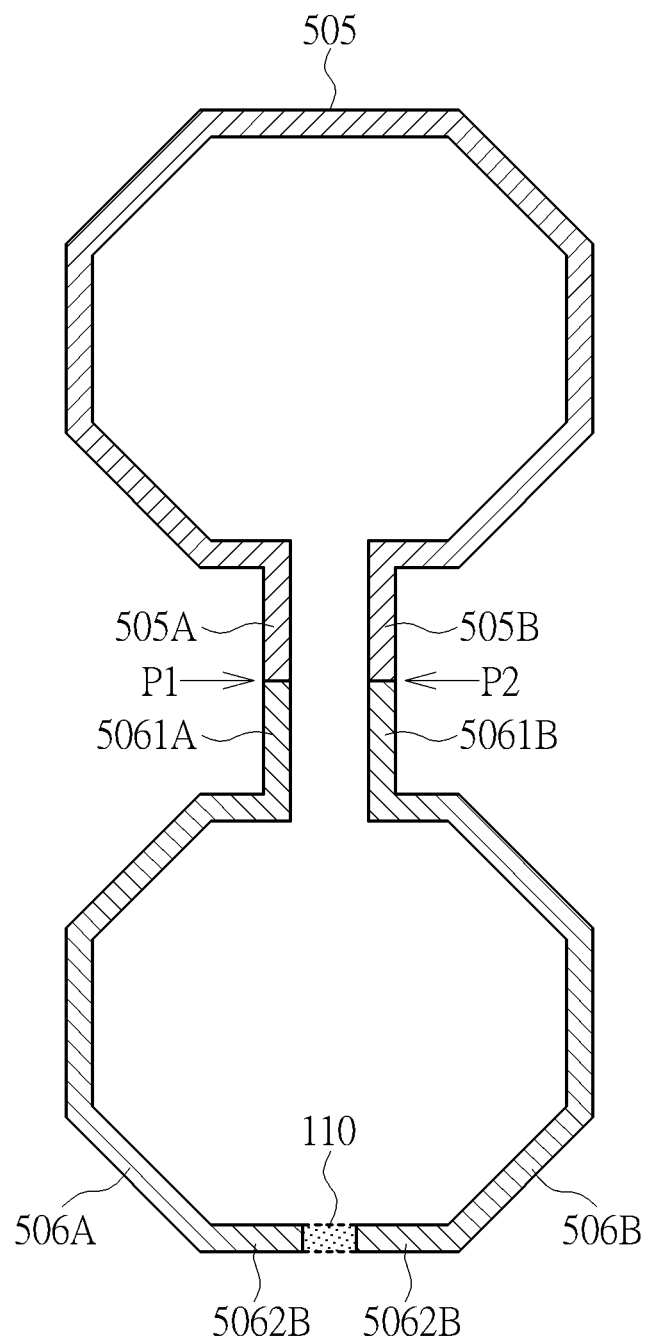
FIG. 5 is a diagram of an implementation layout of inductor device of FIG. 1 according to a third embodiment of the invention.

Additionally, in other embodiments, the wiring of one of the first and second inductors 105 and 106 may are configured to not surround the wiring of the other inductor. FIG. 5 is a diagram of an implementation layout of the inductor device 100 of FIG. 1 according to a third embodiment of the invention. As shown in FIG. 5, the wiring 505 of first inductor 105 and the wiring (506A/506B) of second inductor 106 are disposed on the same metal layer/trace. The wiring 505 of first inductor 105 has a first end 505A coupled to the first port P1 and a second end 505B coupled to the second port P2. The wiring of second inductor 106 comprises a first partial wiring 506A and a second partial wiring 506B. The first partial wiring 506A has a first end 5061A coupled to the first port P1 and a second end 5062A coupled to the switch circuit 110 (represented by dots). The second partial wiring 506B has a first end 5061B coupled to the second port P2 and a second end 5062B coupled to the switch circuit 110. The switch circuit 110 is configured between the first partial wiring 506A and the second partial wiring 506B. The first end 5061A of first partial wiring 506A is connected to the first end 505A of the wiring 505 and may be not overlapped with the first end 505A of the wiring 505 of first inductor 105, and the first end 5061B of second partial wiring 506B is connected to the second end 505B of the wiring 505 and may be not overlapped with the second end 505B of the wiring of first inductor 105; however, this is not meant to be a limitation. In addition, the shape of the wiring 505 of first inductor 105 is an octagon on FIG. 5, and can be other shapes such as a polygon or a circle. In addition, the shape of wiring formed by the first and second partial wirings 506A and 506B if the switch circuit 110 is turned on can be regarded as an octagon, and may be other shapes such as a polygon or a circle in other examples. In addition, each of the wiring 505 and the wiring (506A/506B) on FIG. 5 comprises a single one lap of trace/wiring. In other embodiments, each of the wirings may be implemented by using two or more laps of trace/wiring. Each of the wirings may be a spiral wiring.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching inductor device having a first port and a second port, comprising:
   a first inductor, coupled between the first port and the second port; and
   a second inductor with a switch circuit connected in series, coupled between the first port and the second port, the second inductor comprises:
      a first portion, coupled between the first port and the switch circuit; and
      a second portion, coupled between the switch circuit and the second port; and;
   wherein the first inductor and the second inductor are connected in parallel when the switch circuit is turned on; the switch circuit is disposed between the first portion of the second inductor and the second portion of the second inductor, and the first portion of the second inductor and the second portion of the second inductor is connected in series when the switch circuit is turned on; the first portion is a first partial wiring of the second inductor, and the second portion is a second partial wiring of the second inductor; a wiring of the first inductor disposed on a first metal layer or a wiring of the second inductor disposed on a second metal layer is either an outer wiring or an inner wiring.

2. The switching inductor device of claim 1, wherein the first metal layer is a bottom metal layer, and the second metal layer is a top metal layer.

3. The switching inductor device of claim 1, wherein switch circuit is disposed on another metal layer different from the first metal layer and the second metal layer.

4. The switching inductor device of claim 1, wherein the first metal layer is a top metal layer, and the second metal layer is a bottom metal layer.

5. The switching inductor device of claim 1, wherein the first metal layer and the second metal layer are a same metal layer.

6. The switching inductor device of claim 5, wherein the wiring of the second inductor is surrounded by the outer wiring.

7. An oscillator apparatus, comprising:
   an LC (inductor-capacitor) tank, comprising:
      a capacitor array, coupled to a switching inductor device; and
      the switching inductor device having a first port and a second port, comprising:
         a first inductor, coupled between the first port and the second port; and
         a second inductor with a switch circuit connected in series, coupled between the first port and the second port, the second inductor comprises:
            a first portion, coupled between the first port and the switch circuit; and
            a second portion, coupled between the switch circuit and the second port; and;
         wherein the first inductor and the second inductor are connected in parallel when the switch circuit is turned on; the switch circuit is disposed between the first portion of the second inductor and the second portion of the second inductor, and the first portion of the second inductor and the second portion of the second inductor is connected in series when the switch circuit is turned on; the first portion is a first partial wiring of the second inductor, and the second portion is a second partial wiring of the second inductor; a wiring of the first inductor disposed on a first metal layer or a wiring of the second inductor disposed on a second metal layer is either an outer wiring or an inner wiring.

8. A switching inductor device having a first port and a second port, comprising:
   a first inductor, coupled between the first port and the second port; and
   a second inductor with a switch circuit connected in series, coupled between the first port and the second port, the second inductor comprises:
      a first portion, coupled between the first port and the switch circuit; and a second portion, coupled between the switch circuit and the second port; and;

wherein the first inductor and the second inductor are connected in parallel when the switch circuit is turned on; the switch circuit is disposed between the first portion of the second inductor and the second portion of the second inductor, and the first portion of the second inductor and the second portion of the second inductor is connected in series when the switch circuit is turned on; a first area surrounded by a wiring of the first inductor is not overlapped with a second area surrounded by a wiring of the second inductor.

* * * * *